United States Patent [19]

Davey et al.

[11] 4,267,014

[45] May 12, 1981

[54] SEMICONDUCTOR ENCAPSULANT FOR ANNEALING ION-IMPLANTED GAAS

[75] Inventors: John E. Davey, Alexandria; Aristos Christou; Harry B. Dietrich, both of Springfield, all of Va.

[73] Assignee: The United States of America as represented by the Secretary of the Navy, Washington, D.C.

[21] Appl. No.: 126,088

[22] Filed: Feb. 29, 1980

[51] Int. Cl.³ .................. H01L 21/265; H01L 21/324
[52] U.S. Cl. .................... 156/662; 148/1.5; 427/85; 427/86; 427/87
[58] Field of Search .................... 148/1.5; 427/85–87; 156/662

[56] References Cited

U.S. PATENT DOCUMENTS

| | | | |
|---|---|---|---|
| 4,033,788 | 7/1977 | Hunsperger | 148/1.5 |
| 4,058,413 | 11/1977 | Welch | 148/1.5 |

OTHER PUBLICATIONS

Donnelly et al., "Silicon . . . GaAs . . . annealed . . . ," Applied Physics Letters, 27, No. 1, p. 44–43, Jul. 1975.
Kasahara et al., "Capless anneal of ion-implanted GaAs . . . ," J. Appl. Phys. 50 (1), Jan. 1979, pp. 541–543.
Vaidyanathan et al., "Study of Encapsulants for Annealing GaAs", J. Electrochem. Soc.:Solid State Science and Technology, 124, Noll, pp. 1781–1784, Nov. 1977.
Lidow et al., "Multilayered Encapsulation of GaAs", J. Appl. Phys. 49 (10), pp. 5213–5217, Oct. 1978.
Anderson et al., "Smooth and Continuous Ohmic Contacts to GaAs using Epitaxial Ge Films", J. Appl. Phys. 49 (5), p. 2998, May 1978.
Christou et al., "Epitaxial Growth of AlKaAlAs Films on (100) GaAs by Hot Vacuum Deposition", J. Appl. Phys. 50 (2), p. 1139, Feb. 1979.

*Primary Examiner*—John D. Smith
*Attorney, Agent, or Firm*—R. S. Sciascia; William T. Ellis; Melvin L. Crane

[57] ABSTRACT

A method for protecting an ion-implanted substrate during the annealing process by covering the ion-implanted layer with a suitable encapsulant. A thin layer of ions are implanted into a GaAs substrate. A protective layer of germanium, amorphous GaAs, doped GaAs, or GaAlAs is applied over the implanted layer and on the periphery of the ion-implanted GaAs substrate. The composite is annealed at a temperature which is adequate for the lattice to recover from the ion-implantation-induced damage. The protective layer is removed subsequent to the anneal step, without any damage to the ion-implanted layer.

11 Claims, 5 Drawing Figures

SEMICONDUCTOR ENCAPSULANT FOR ANNEALING ION-IMPLANTED GaAs

BACKGROUND OF THE INVENTION

This invention relates to ion-implanted GaAs and more particularly to encapsulating ion-implanted GaAs during annealing of the composite.

It is well known in the art that ion-implanted GaAs must be annealed to temperatures greater than 800° C. to remove process-induced damage and to induce implanted dopants to go into substitutional or active sites. At this high anneal temperature, arsenic eveporates from the GaAs leaving a non-stoichiometric residue of little technical use. Prior-art methods use $SiO_2$, $Si_3N_4$ or same combination of the two in thin-film form as encapsulants to protect the ion-implanted substrate during the anneal process. These prior-art encapsulants are not lattice-/and thermally matched with GaAs and they are difficult to control during deposition. Thus, alternative encapsulants are desirable.

SUMMARY OF THE INVENTION

This invention provides a protective encapsulant for the annealing of ion-implanted GaAs. The encapsulant is lattice-/and thermal-coefficient-compatible with the ion-implanted GaAs and is easily removed without damage to the ion-implanted surface. The encapsulant of this invention is easily controlled for uniformity by using a vacuum deposition process to produce the film.

DETAILED DESCRIPTION

In each of the modifications in FIGS. 1–5, ions are implanted into GaAs substrate. The ion-implanted GaAs is then encapsulated with a material which is lattice-matched and thermally matched to GaAs to protect the surface during high-temperature annealing of the composite.

Figure 1:
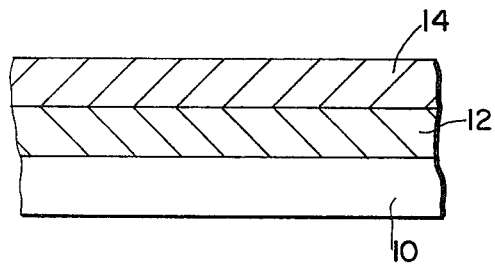
FIG. 1 illustrates an ion-implanted GaAs substrate with a protective Ge encapsulant.

FIG. 1 illustrates a GaAs substrate 10 in which ions, such as Si, Se, Be, or Mg, have been implanted to a dosage such as $5 \times 10^{18}$ ions/cm³. The ions are implanted to a desired depth by use of well-known ion implantation equipment to form a layer 12. Once the ions have been implanted, a protective layer 14 or encapsulant of germanium is vacuum deposited onto the ion-implanted layer to a thickness of about $3 \times 10^{3°}$ A at a temperature of about 475° C. with a vacuum pressure of $1 \times 10^{-9}$ Torr. Subsequent to the vacuum deposition of the Ge layer, the composite is annealed at a temperature which is adequate for the lattice to recover from any implantation-induced damage. An appropriate temperature is from about 450° C. to about 850° C., depending on both dopant and encapsulating layer. In the case of the Ge encapsulant the high temperature limit is 700° C. The Ge layer prevents dissociation and evaporation of the ion-implanted GaAs during the anneal process.

Subsequent to annealing the composite, the Ge layer is etched away by use of a conductivity-sensitivity selective etchant. A conductivity-sensitivity selective etchant is an etchant in which the rate is affected by the conductivity of the material such as a mixture of hydrofloric acid, hydrozen peroxide and water having a mixture ratio of 1:1:10. Ge and other suitable encapsulants have a preferential etch rate; therefore, they can be removed from the GaAs host without damage to the GaAs.

Figure 2:
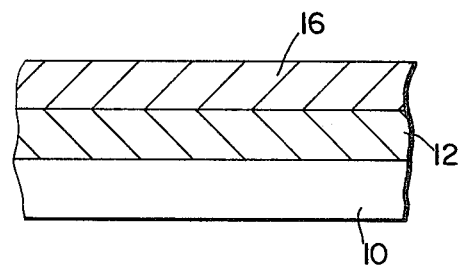
FIG. 2 illustrates an ion-implanted GaAs substrate with a protective amorphous GaAs encapsulant.

In the configuration of FIG. 2 the steps of the process are the same as set forth above for FIG. 1. The only difference is that amorphous GaAs 16 rather than Ge is used as the encapsulant. Since amorphous GaAs is non-crystalline and non-crystalline, GaAs etches faster than crystalline GaAs, the amorphous layer can be preferentially etched after anneal.

Figure 3:
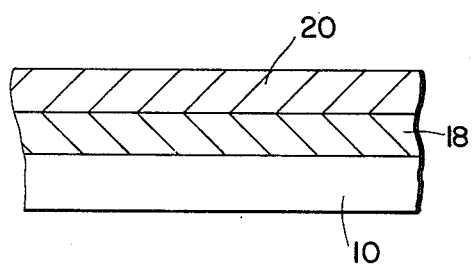
FIG. 3 illustrates an ion-implanted GaAs substrate with a protective n-type GaAs encapsulant.

In the GaAs device shown in FIG. 3, the ion-implanted layer 18 is p-type and the encapsulant 20 is n-type GaAs deposited to a thickness of about $3 \times 10^{3°}$ A. The process of ion implantation and depositing the encapsulant are the same as shown above for the device of FIG. 1. After annealing the ion implanted device, a conductivity-sensitivity selective etchant is used to remove the encapsulant.

Figure 4:
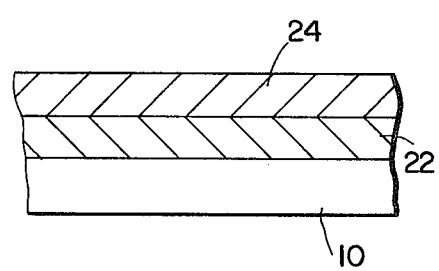
FIG. 4 illustrates an ion-implanted GaAs substrate with a protective p-type GaAs encapsulant.

The GaAs device of FIG. 4 is the reverse of that shown in FIG. 3. The implanted layer 22 of ions is n-type and the GaAs encapsulant 24 is of the p-type. The process is the same as set forth above for the GaAs device of FIG. 3.

Figure 5:
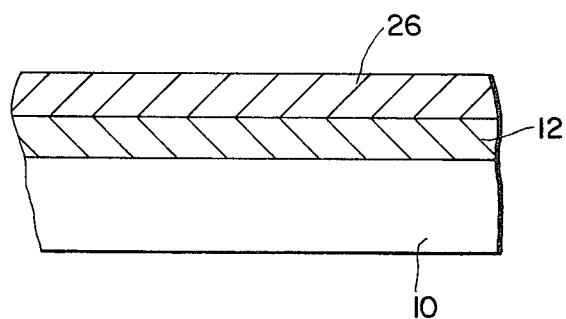
FIG. 5 illustrates an ion-implanted GaAs substrate with a protective GaAlAs encapsulant.

FIG. 5 illustrates a GaAs device in which the ion-implanted layer is the same as shown in FIGS. 1 and 2. The encapsulant 26 is formed by GaAlAs. The process is as set forth above. In the case of GaAs or GaAlAs encapsulant, the upper anneal temperature is 850° C. In the GaAs devices of FIG. 5, after annealing, the encapsulant is removed by selective chemical etching.

Germanium, gallium-arsenide, and gallium-aluminum-arsenide, encapsulants have the advantage that they lattice-match and thermally match the gallium-arsenide substrate. These encapsulants are easily and reproducibly vacuum-deposited upon the substrate. Their purity is easily controlled by using the vacuum deposition process to form the encapsulant. These encapsulants have a chemically preferential etch rate after anneal and may be removed without any damage to the host GaAs crystal.

In each of the modifications shown, the encapsulant provides a protective layer during annealing of ion-implanted GaAs in which the annealing process removes ion implantation damage and allows implanted dopants to be included in substitutional sites.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method of forming an ion-implanted GaAs device which comprises:
   implanting ions into one surface of a GaAs substrate,
   vacuum-depositing onto said ion-implanted surface an encapsulant selected from the group consisting of germanium, gallium-arsenide, and gallium-aluminum-arsenide, annealing said encapsulated, ion-implanted GaAs substrate to remove any ion implantation damage, subsequent to annealing said encapsulated ion-implanted GaAs substrate, selective-chemical-etching said encapsulant to remove said encapsulant from said ion-implanted GaAs substrate without any damage to said ion-implanted GaAs substrate.

2. A method as claimed in claim 1 in which:

said encapsulant is germanium.

3. A method as claimed in claim 1 wherein:

said encapsulant is amorphous gallium arsenide.

4. A method as claimed in claim 3 wherein:

said encapsulant is a layer of gallium-aluminum-arsenide.

5. A method as claimed in claim 1 wherein:

said encapsulant is deposited uniformly to a thickness of about $3 \times 10^3$ Å.

6. A method as claimed in claim 5 wherein:

said encapsulant is n-type GaAs and said ion-implanted layer is p-type.

7. A method as claimed in claim 5 wherein:

said encapsulant is p-type GaAs, and said ion-implanted layer is n-type.

8. A method as claimed in claim 5 wherein:

said ions are implanted to a dosage of about $5 \times 10^{18}$ ions/cm$^3$ and, said encapsulant is vacuum-deposited at a temperature of from 450° C. to about 500° C. at a vacuum pressure of about $1 \times 10^{-9}$ Torr.

9. A method as claimed in claim 8 wherein:

said encapsulated ion-implanted GaAs is annealed at a temperature of from about 450° C. to about 850° C. for about one hour depending upon the specific dopant and encapsulant used.

10. A method of forming an ion-implanted GaAs device which comprises;

implanting ions into one surface of a semiconductive crystalline substrate, vacuum-depositing onto said ion-implanted surface an encapsulant which is lattice-matched and thermally matched to the substrate material;

annealing said encapsulated, ion-implanted GaAs substrate to remove any ion implantation damage, subsequent to annealing said encapsulated ion-implanted GaAs substrate, selective-chemical-etching said encapsulant to remove said encapsulant from said ion-implanted GaAs substrate without any damage to said ion-implanted GaAs substrate.

11. A method as set forth in claim 10, wherein:

said substrate is formed from GaAs.

* * * * *